United States Patent
Lee et al.

(10) Patent No.: US 10,763,217 B2
(45) Date of Patent: Sep. 1, 2020

(54) SEMICONDUCTOR PACKAGE AND ANTENNA MODULE INCLUDING THE SAME

(71) Applicant: SAMSUNG ELECTRONICS CO., LTD., Suwon-si (KR)

(72) Inventors: Yong Koon Lee, Suwon-si (KR); Jin Su Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/282,638

(22) Filed: Feb. 22, 2019

(65) Prior Publication Data

US 2020/0035607 A1    Jan. 30, 2020

(30) Foreign Application Priority Data

Jul. 27, 2018  (KR) .................. 10-2018-0087760

(51) Int. Cl.
*H01L 23/538* (2006.01)
*H01L 23/00* (2006.01)
(Continued)

(52) U.S. Cl.
CPC ...... *H01L 23/5386* (2013.01); *H01L 23/3128* (2013.01); *H01L 23/3171* (2013.01);
(Continued)

(58) Field of Classification Search
CPC . H01L 23/5386; H01L 23/3171; H01L 24/17; H01L 23/3128; H01L 23/5226;
(Continued)

(56) References Cited

U.S. PATENT DOCUMENTS 9,373,605 B1    6/2016  Wang et al.
2014/0110856 A1    4/2014  Lin
(Continued)

FOREIGN PATENT DOCUMENTS

JP    2004-146419 A    5/2004
KR    10-2014-0050507 A    4/2014
(Continued)

OTHER PUBLICATIONS

Communication dated Oct. 1, 2019 issued by the Korean Patent Office in counterpart Korean Application No. 10-2018-0087760.

*Primary Examiner* — Fernando L Toledo
*Assistant Examiner* — Adam S Bowen
(74) *Attorney, Agent, or Firm* — Sughrue Mion, PLLC

(57) ABSTRACT

A semiconductor package and an antenna module including the same includes a frame having first and second throughholes, a semiconductor chip disposed in the first throughhole of the frame and having an active surface on which a connection pad is disposed and an inactive surface disposed on an opposite side of the active surface, a wiring chip disposed in the second through-hole of the frame and including a body portion and a plurality of through vias penetrating the body portion, an encapsulant encapsulating at least portions of the semiconductor chip and the wiring chip, and a connection member disposed on the active surface of the semiconductor chip and including a redistribution layer electrically connected to the connection pad of the semiconductor chip and the through via of the wiring chip.

21 Claims, 17 Drawing Sheets

(51) Int. Cl.
*H01L 23/31* (2006.01)
*H01L 25/065* (2006.01)
*H01L 23/522* (2006.01)

(52) U.S. Cl.
CPC ...... *H01L 23/5226* (2013.01); *H01L 23/5383* (2013.01); *H01L 24/09* (2013.01); *H01L 24/17* (2013.01); *H01L 25/0655* (2013.01); *H01L 2224/02373* (2013.01); *H01L 2224/02377* (2013.01); *H01L 2224/02379* (2013.01); *H01L 2924/1205* (2013.01)

(58) Field of Classification Search
CPC . H01L 24/09; H01L 25/0655; H01L 23/5383; H01L 2224/02373; H01L 2224/02377; H01L 2924/1205; H01L 2224/02379
USPC .......................................................... 257/690
See application file for complete search history.

(56) References Cited

U.S. PATENT DOCUMENTS

| | | | | |
|---|---|---|---|---|
| 2015/0016078 A1* | 1/2015 | Yang | ...................... | H05K 1/024 361/762 |
| 2016/0268214 A1* | 9/2016 | Yu | ........................... | H01L 23/16 |
| 2016/0322332 A1* | 11/2016 | Kim | ........................ | H01L 23/16 |
| 2017/0040266 A1* | 2/2017 | Lin | ...................... | H01L 23/5383 |
| 2018/0145033 A1 | 5/2018 | Yi et al. | | |
| 2019/0164892 A1 | 5/2019 | Franz et al. | | |

FOREIGN PATENT DOCUMENTS

| | | |
|---|---|---|
| KR | 10-2017-0009687 A | 1/2017 |
| KR | 10-2018-0058095 A | 5/2018 |
| WO | 2017215771 A1 | 12/2017 |

* cited by examiner

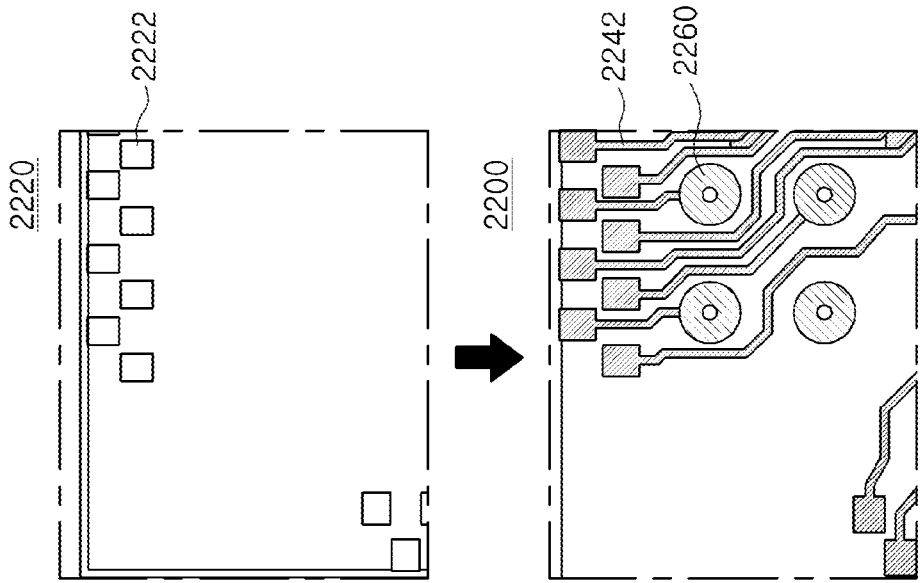
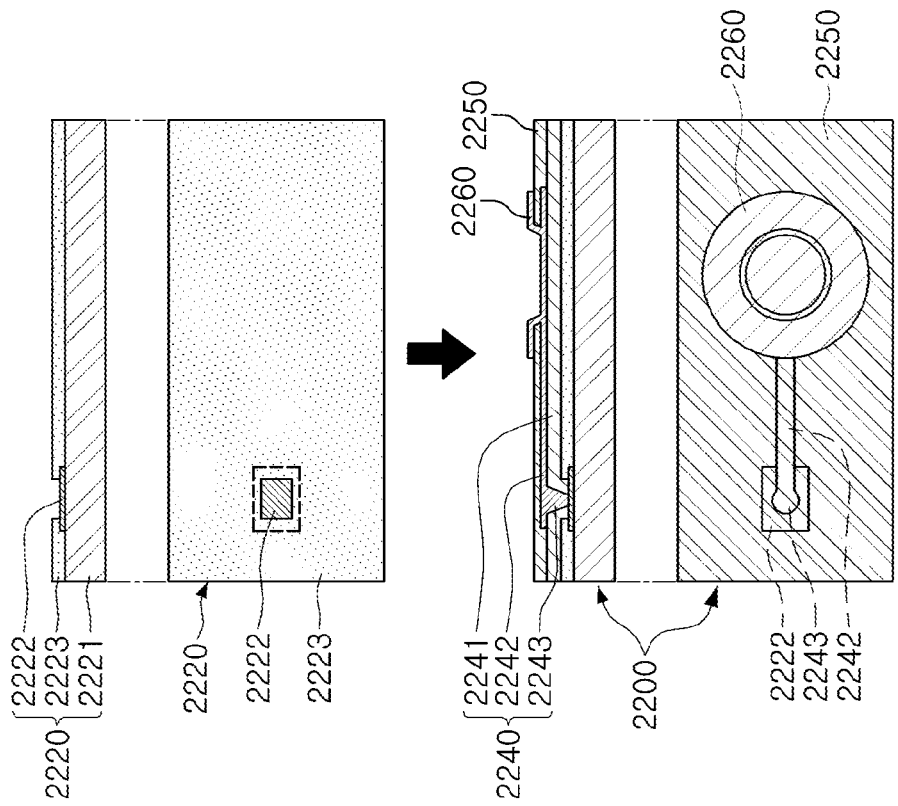
FIG. 3B
FIG. 3A

SEMICONDUCTOR PACKAGE AND ANTENNA MODULE INCLUDING THE SAME

CROSS-REFERENCE TO RELATED APPLICATION(S)

This application claims the benefit of priority to Korean Patent Application No. 10-2018-0087760 filed on Jul. 27, 2018, with the Korean Intellectual Property Office, the disclosure of which is incorporated herein by reference in its entirety.

TECHNICAL FIELD

The present disclosure relates to a semiconductor package and an antenna module including the same.

BACKGROUND

In recent years, with the trend for high performance in electronic devices, various components mounted on mobile devices, such as smartphones, have been used at higher frequencies and bandwidths are increasing. Particularly, in the case of an antenna module for mm-Wave and 5G, it is necessary to significantly reduce mutual interference between the components in the antenna module, together with miniaturization. Accordingly, even in the semiconductor package mounted on the antenna module, it is necessary to have various electromagnetic wave shielding structures to realize excellent shielding characteristics against electromagnetic interference (EMI).

SUMMARY

An aspect of the present disclosure may provide a semiconductor package and an antenna module including the same and a semiconductor chip. Mutual interference is eliminated in the antenna module by enhancing electrical shielding between a through via, through which a high frequency signal or high speed data passes.

According to an aspect of the present disclosure, in a semiconductor package and an antenna module including the same, a through via disposed in a semiconductor package is mounted in a form of a wiring chip.

For example, according to an aspect of the present disclosure, a semiconductor package includes: a frame having first and second through-holes; a semiconductor chip disposed in the first through-hole of the frame and having an active surface on which a connection pad is disposed and an inactive surface disposed on an opposite side of the active surface; a wiring chip disposed in the second through-hole and including a body portion and a plurality of through vias penetrating the body portion; an encapsulant encapsulating at least portions of the semiconductor chip and the wiring chip; and a connection member disposed on the active surface of the semiconductor chip and including a redistribution layer electrically connected to the connection pad of the semiconductor chip and the through via of the wiring chip.

BRIEF DESCRIPTION OF DRAWINGS

The above and other aspects, features and other advantages of the present disclosure will be more clearly understood from the following detailed description taken in conjunction with the accompanying drawings, in which.

FIGS. 3A and 3B are schematic cross-sectional views illustrating states of a fan-in semiconductor package before and after being packaged;

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

In the present disclosure, the terms "lower portion," "lower surface," and the like, may imply a direction towards a mounting surface of a fan-out semiconductor package, and the terms "upper portion," "upper surface," and the like, may indicate the opposite direction. However, the directions are defined as above for ease of description, and the scope of present disclosure is not particularly limited thereto.

In the present disclosure, the term "connected," or "connecting" may include the case in which components are indirectly connected through an adhesive layer, or the like. Also, "electrically connected," or "electrically connecting" may include the case in which components are physically connected and the case in which components are not physically connected. In addition, the terms "first," and "second" are used to distinguish one component from another, and do not delimit an order and/or importance, and the like, of the components. In some cases, a first component may be referred to as a second component without departing from the scope of rights of the present disclosure, and likewise a second component may be referred to as a first component.

The term "exemplary embodiment" may not necessarily indicate one same exemplary embodiment, but may be provided to emphasize different unique features of the present disclosure. However, it may not necessarily exclude a combination of the suggested exemplary embodiments with another exemplary embodiment. For example, although a description of a certain component in one exemplary embodiment is not provided in another exemplary embodiment, it is to be understood that the description may relate to the other exemplary embodiment unless otherwise indicated in the other exemplary embodiment.

The terms used in the present disclosure are used to describe exemplary embodiments, and are not intended to be limiting. A singular term includes a plural form unless otherwise indicated.

Electronic Device

Figure 1:
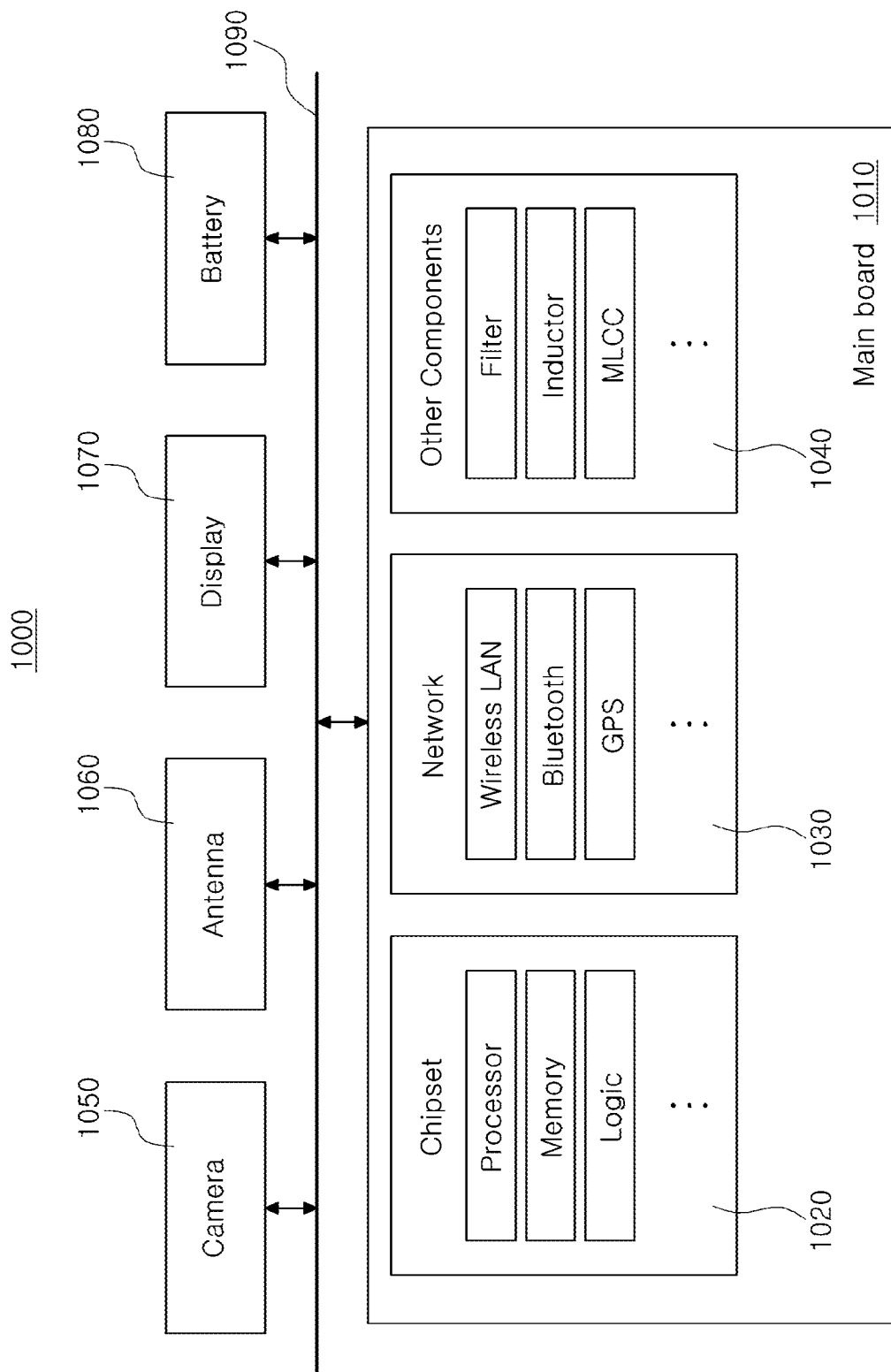
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010. The mainboard 1010 may be physically and/or electrically connected to chip-related components 1020, network-related components 1030, other components 1040, and the like. These components may be combined with other components to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip-related components 1020 are not limited thereto, but may also include other types of chip-related components. In addition, the chip-related components 1020 may be combined with each other.

The network-related components 1030 may include wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the above-mentioned protocols. However, the network-related components 1030 are not limited thereto, and may also include a variety of other wireless or wired standards or protocols. Further, the network-related components 1030 may be combined with each other, together with the chip-related components 1020 described above.

Other components 1040 may include a high frequency inductor, a ferrite inductor, a power inductor, ferrite beads, low temperature co-firing ceramics (LTCC), an electromagnetic interference (EMI) filter, a multilayer ceramic capacitor condenser (MLCC), or the like. However, other components 1040 are not limited thereto, but may also include passive components used for various other purposes, and the like. In addition, other components 1040 may be combined with each other, together with the chip-related components 1020 and/or the network-related components 1030.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), and the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive component, or the like. However, the electronic device 1000 is not limited thereto, and may be any other electronic device processing data.

Figure 2:
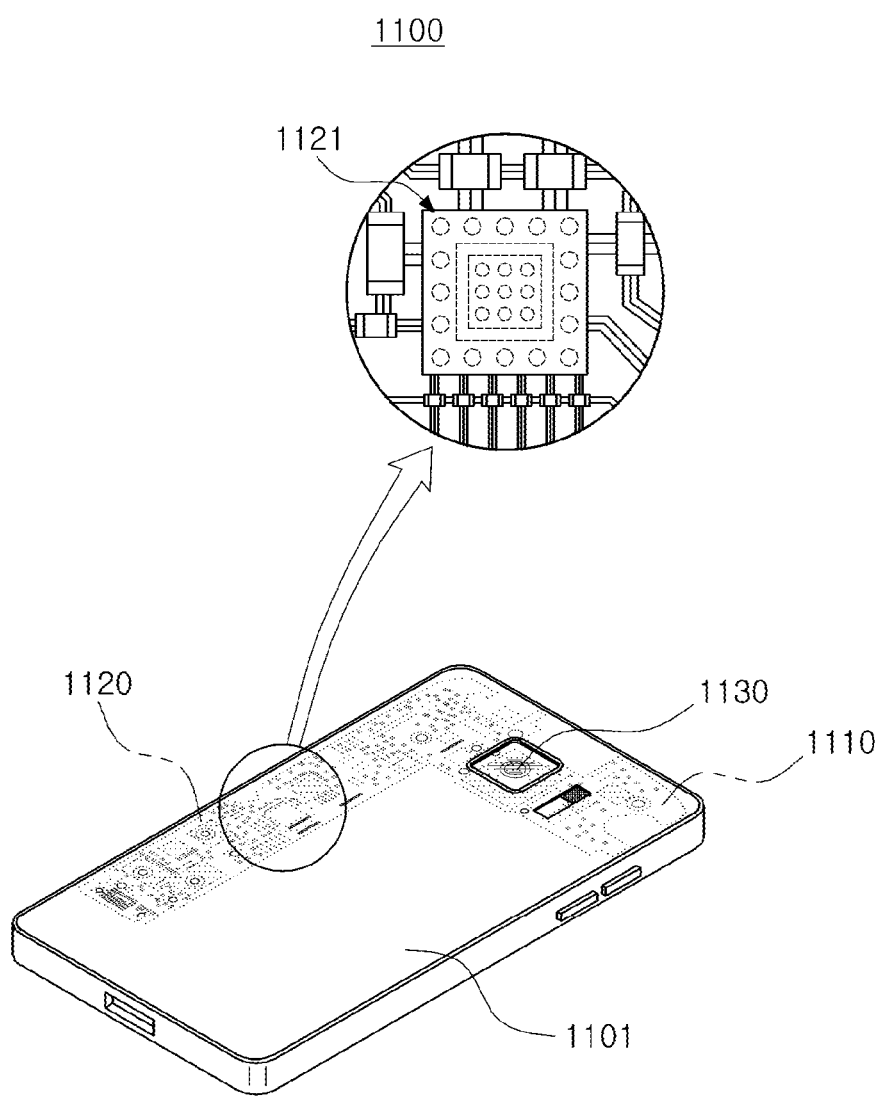
FIG. 2 is a schematic perspective view illustrating an example of an electronic device.

FIG. 2 is a schematic perspective view illustrating an example of an electronic device.

Referring to FIG. 2, a semiconductor package may be used for various purposes in various electronic devices as described above. For example, a mainboard 1110 may be provided in a body 1101 of a smartphone 1100, and various components 1120 may be physically or electrically connected to the mainboard 1110. In addition, other components that may or may not be physically or electrically connected to the mainboard 1010, such as a camera 1130, may be accommodated in the body 1101. Some of the electronic components 1120 may be the chip-related components, and the semiconductor package 1121 may be, for example, an application processor among the chip-related components, but is not limited thereto. The electronic device is not necessarily limited to the smartphone 1100, and may be other electronic devices as described above.

Semiconductor Package

Generally, in a semiconductor chip, numerous fine electrical circuits are integrated, but the semiconductor chip may not serve as a finished semiconductor product in itself, and may be damaged due to external physical or chemical impacts. Therefore, the semiconductor chip itself may not be used, and may be packaged and used in an electronic device, or the like, in a packaged state.

A semiconductor packaging may be desirable because there may be a difference between a width of a circuit of a semiconductor chip a width of a circuit of a mainboard of an electronic device in terms of electrical connection. Specifically, in the case of a semiconductor chip, a size of connection pads of a semiconductor chip and an interval between the connection pads may be very fine, but in the case of a mainboard used in electronic devices, a size of component mounting pads of a mainboard and an interval between the component mounting pads are significantly larger than those of a semiconductor chip. Therefore, it may be difficult to directly mount the semiconductor chip on the mainboard, and packaging technology for buffering a difference in circuit width between the semiconductor chip and the mainboard may be needed.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

FIGS. 3A and 3B are schematic cross-sectional views illustrating states of a fan-in semiconductor package before and after being packaged.

Figure 4:
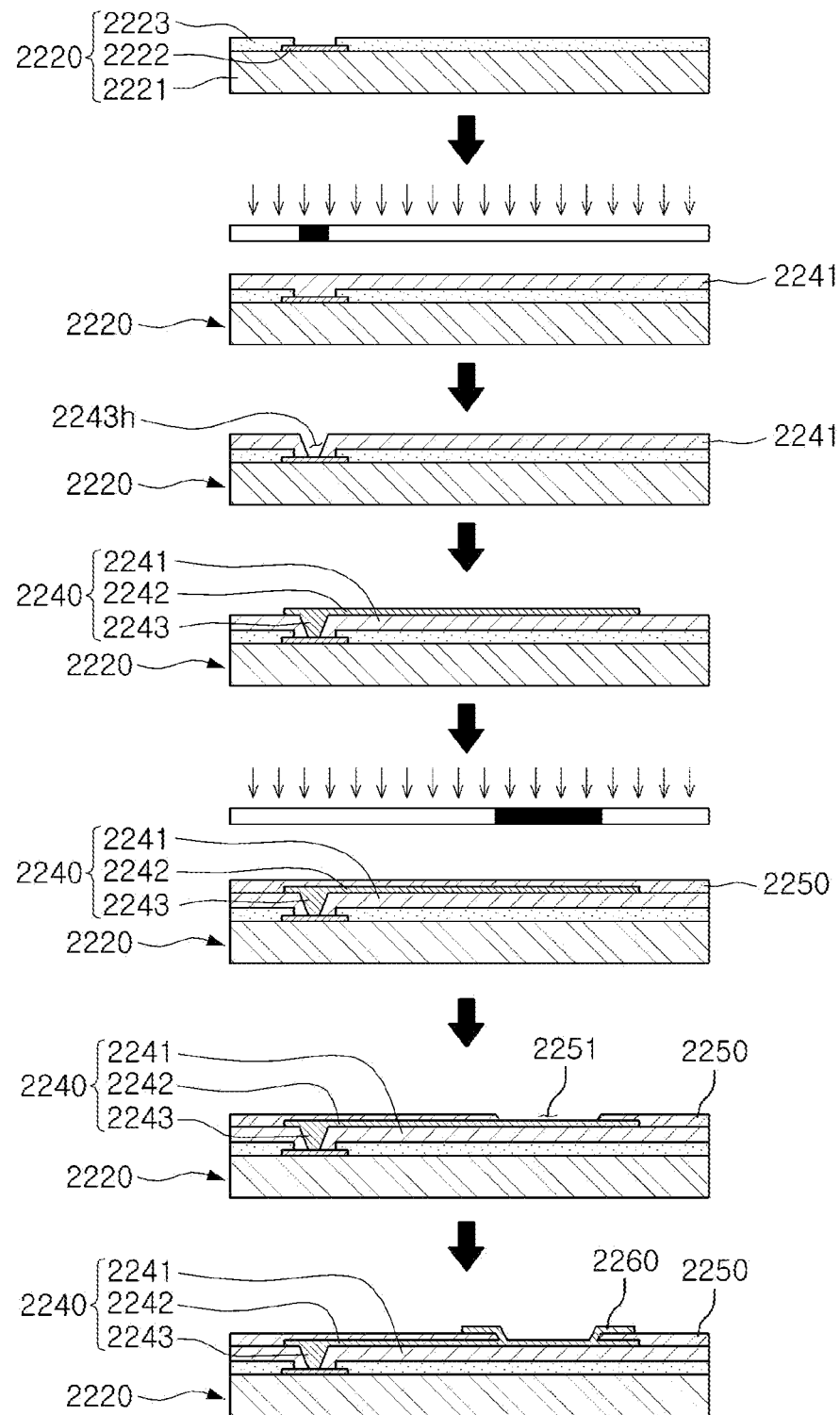
FIG. 4 is a schematic cross-sectional view illustrating a packaging process of a fan-in semiconductor package.

FIG. 4 is a schematic cross-sectional view illustrating a packaging process of a fan-in semiconductor package.

Referring to the FIGS. 3A through 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on a mainboard of an electronic device, or the like.

Therefore, to redistribute the connection pads 2222, a connection member 2240 may be formed depending on a size of the semiconductor chip 2220 on the semiconductor chip 2220. The connection member 2240 may be formed by forming an insulating layer 2241 on the semiconductor chip 2220 using an insulating material such as photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip, are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the issues described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
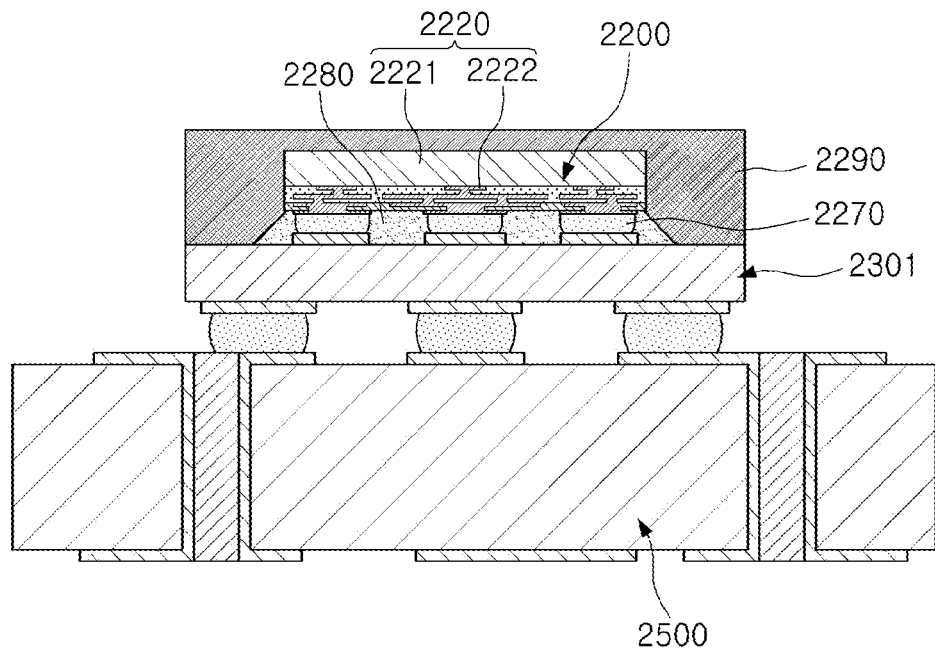
FIG. 5 is a schematic cross-sectional view illustrating a case in which a fan-in semiconductor package is mounted on an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
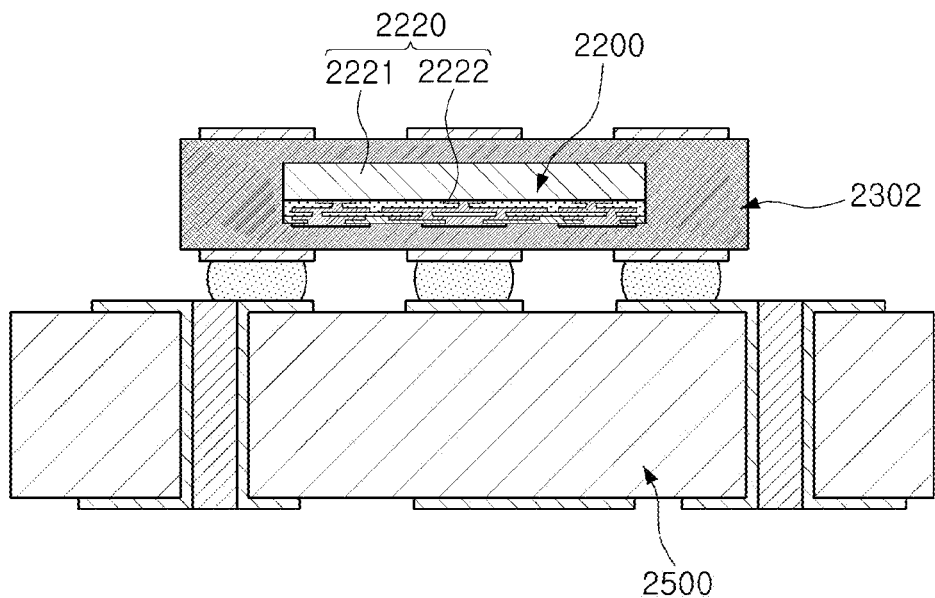
FIG. 6 is a schematic cross-sectional view illustrating a case in which a fan-in semiconductor package is embedded in an interposer substrate and is ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an external surface of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
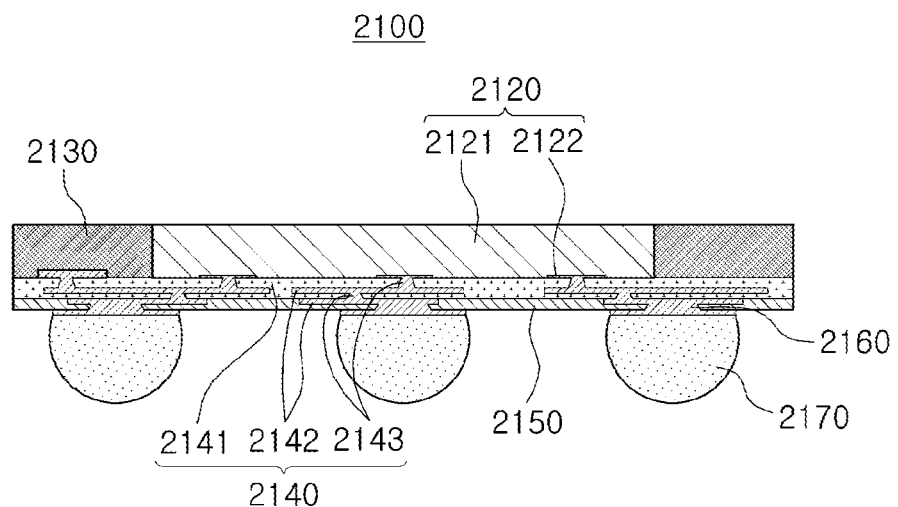
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in an opening of the passivation layer 2150. Solder balls 2170 may further be formed on the underbump metal layer 2160. The semiconductor chip 2120 may be an integrated circuit (IC) including a body 2121, the connection pads 2122, a passivation film (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As such, the fan-out semiconductor package may have a form in which I/O terminals are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
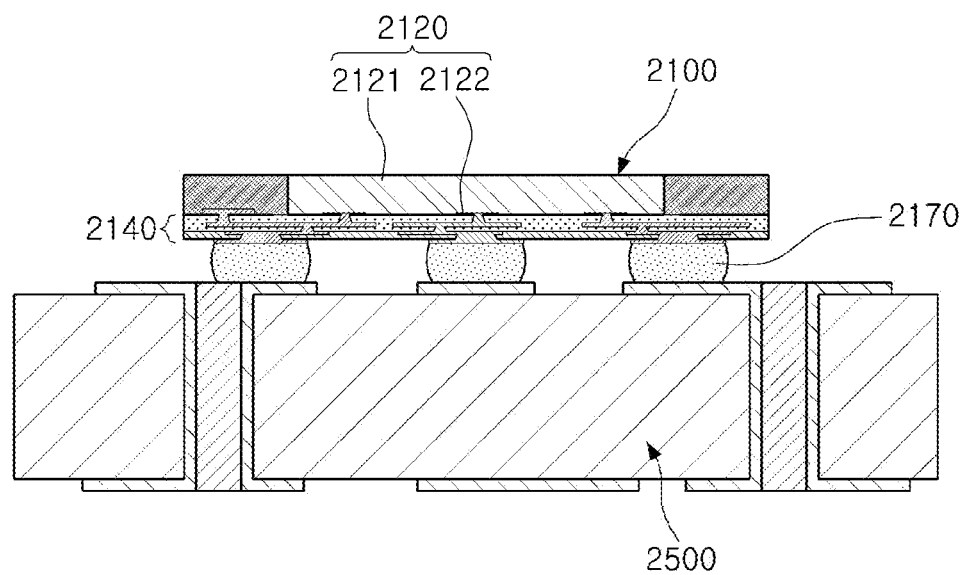
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 capable of redistributing the connection pads 212 capable of redistributing the connection pads 2122 up to a fan-out area that is beyond of a size of the semiconductor chip 2120 on the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. In addition, the fan-out semiconductor package may be implemented in a more compact form than that of a general package-on-package (POP) type using a printed circuit board (PCB), and may solve a problem due to the occurrence of warpage.

The fan-out semiconductor package refers to package technology for mounting the semiconductor chip on the mainboard of the electronic device, or the like, as described above, and protecting the semiconductor chip from external impacts Fan-out semiconductor package is a concept different from that of a printed circuit board (PCB) such as an interposer substrate, or the like, having a scale, a purpose, and the like, different from those of the fan-out semiconductor package, and having the fan-in semiconductor package embedded therein.

Antenna Module

Figure 9:
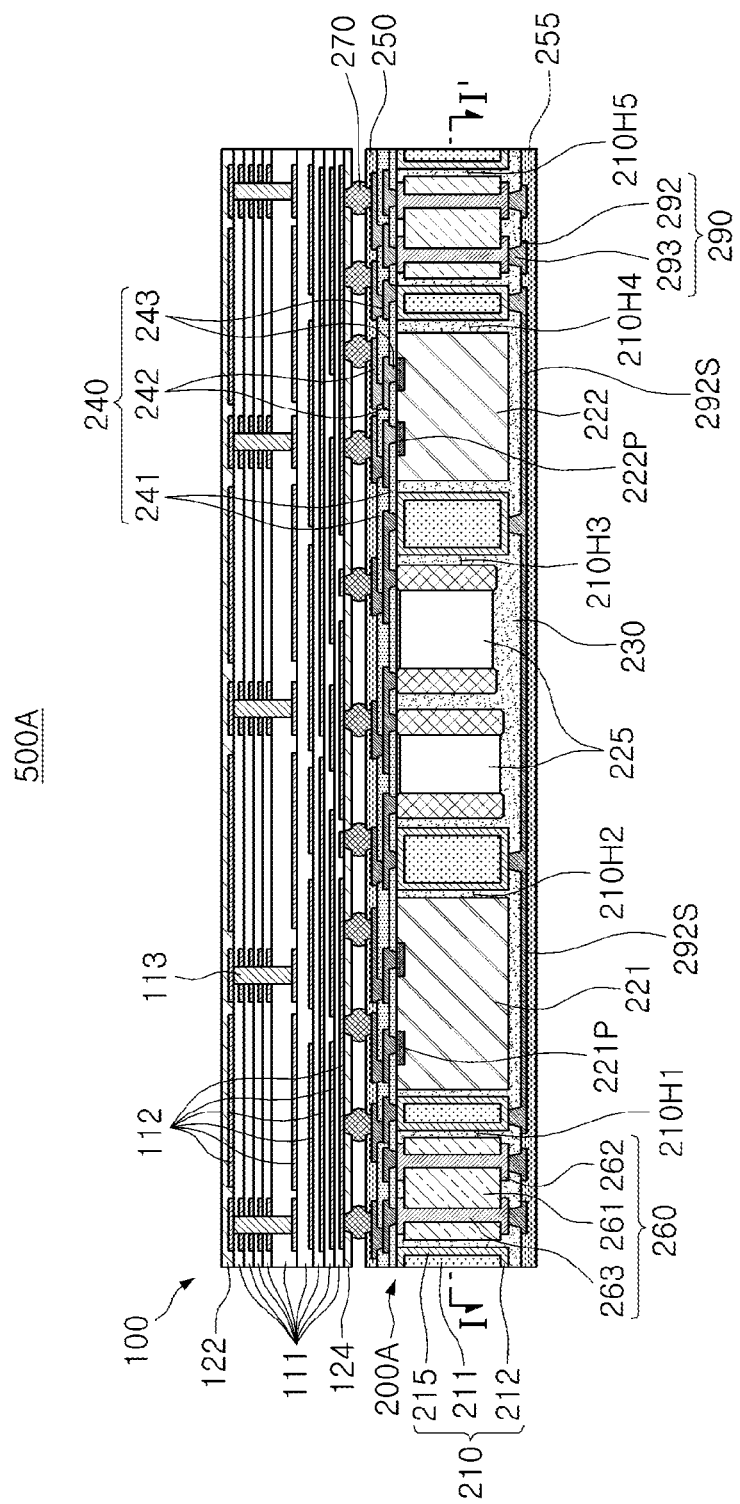
FIG. 9 is a schematic cross-sectional view illustrating an example of an antenna module.

FIG. 9 is a schematic cross-sectional view illustrating an example of an antenna module.

Figure 10:
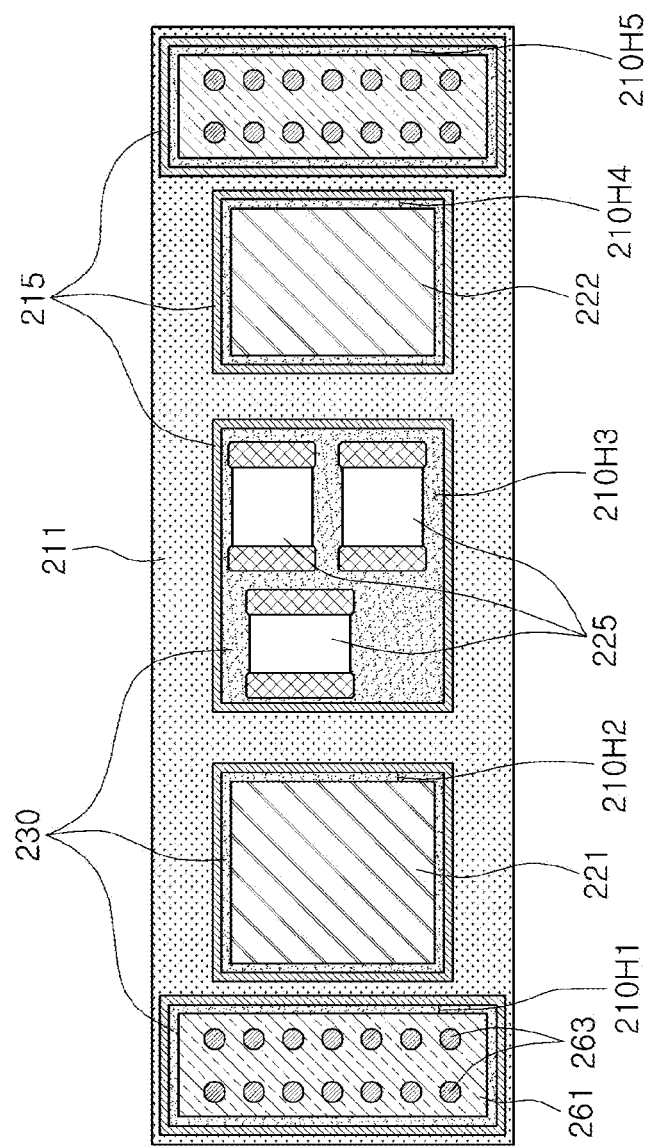
FIG. 10 is a schematic cut-away plan view taken along line I-I' of the antenna module of FIG. 9.

FIG. 10 is a schematic cut-away plan view taken along line I-I' of the antenna module of FIG. 9;

Referring to FIGS. 9 and 10, an antenna module 500A according to an exemplary embodiment in the present disclosure may include an antenna substrate 100 and a semiconductor package 200A disposed on a lower surface of the antenna substrate 100 to be electrically connected to the antenna substrate 100. The antenna substrate 100 may be an area capable of implementing millimeter (mm) wave/5G antenna, and include a substrate wiring layer 112 including an antenna pattern and a ground pattern. Specifically, the antenna substrate 100 may include a substrate insulating layer 111, a substrate wiring layer 112, a connection via layer 113, and substrate passivation layers 122 and 124. The semiconductor package 200A may include a frame 210 having first to fifth through-holes 210H1, 210H2, 210H3, 210H4, and 210H5, a metal layer 215 disposed on internal walls of the first to fifth through-holes 210H1, 210H2, 210H3, 210H4, and 210H5, a wiring chip 260 disposed in the first and fifth through-holes 210H1 and 210H5 of the frame 210, first and second semiconductor chips 221 and 222 disposed in the second and fourth through-holes 210H2 and 210H4 of the frame 210 and having an active surface on which connection pads 221P and 222P are disposed and an inactive surface disposed on an opposite side of the active surface, at least one passive component 225 disposed in the third through-hole 210H3 of the frame, an encapsulant 230 encapsulating at least portions of the frame 210, the wiring chip 260, the first and second semiconductor chips 221 and 222, and the passive component 225, a connection member 240 disposed on the frame 210, the wiring chip 260, the active surfaces of the first and second semiconductor chips 221 and 222 and the passive component 225, a passivation layer 250 disposed on the connection member 240, an electrical connection structure 270 disposed on an opening of the passivation layer 250, and a backside wiring structure 290 disposed on a lower portion of the frame 210.

Recently, in accordance with the trend toward high performance of electronic devices, various components mounted on mobile devices such as smartphones have been used at higher frequencies and bandwidths thereof are increasing. Particularly, in the case of a millimeter (mm) wave/5G antenna module, a structure to prevent electromagnetic interference (EMI) between mounting components such as a semiconductor chip using a high frequency may be required.

Meanwhile, when an antenna module is implemented in a general system-in-package (SIP) type module manner, various semiconductor chips and passive components are mounted on a bottom surface of an antenna substrate by surface mount technology (SMT), respectively, and in order to provide electromagnetic wave shielding, a shield covering the semiconductor chips and the passive components is attached to the semiconductor chips and the passive components or the semiconductor chips and the passive components are covered with an epoxy molding compound (EMC), and a metal layer is then formed on an outer surface of the EMC.

On the other hand, in an antenna module 500A according to an exemplary embodiment, a semiconductor package 200A in which various semiconductor chips 221 and 222 and a passive component 225 are packaged in one package on an antenna substrate 100 may be mounted, and a through via 263 electrically connecting between the antenna substrate 100 and the semiconductor package 200A together with the semiconductor chips 221 and 222 and the passive component 225 may be packaged in the semiconductor package 200A in the form of capsulated wiring chip 260. The wiring chip 260 may be separately mounted in the through-holes 210H1 and 210H5 separate from the through-holes 210H2, 210H3 and 210H4 in which the semiconductor chips 221 and 222 and the passive component 225 are mounted, such that the electrical shielding may be enhanced. In particular, the through via 263 in the wiring chip 260 may be electrically connected to the upper antenna substrate 100 to provide a path for high-speed data or RF frequency signals. Therefore, the through via 263 may be located in the separate through-holes 210H1 and 210H5 in the form of the wiring chip 260 such that the shielding between the electronic components such as the semiconductor chips 221 and 222 and the passive component 225, and the through via 263 can be enhanced.

A metal layer 215 may be disposed on side walls of the through-holes 210H1, 210H2, 210H3, 210H4, and 210H5. The metal layer 215 may be formed entirely on wall surfaces of each of the through-holes 210H1, 210H2, 210H3, 210H4, and 210H5 to surround the wiring chip 260, the semiconductor chips 221 and 222, and the passive component 225. Thus, the effect of electromagnetic wave shielding may be enhanced and the heat dissipation characteristics may be improved.

In addition, a backside wiring layer 292, a portion of a backside wiring structure 290, may be disposed on the inactive surface of the semiconductor chips 221 and 222 and the semiconductor chips 221 and 222 may be mounted such that a shielding structure may be disposed on five surfaces including side surfaces and lower surfaces. In this case, the backside via 293 connected to the backside metal layer 292S may be a line via having a linear shape. The electromagnetic wave shielding for the semiconductor chips 221 and 222 may be further enhanced by the backside metal layer 292S and the backside via 293 having a linear shape.

Hereinafter, each configuration included in the antenna module 500A according to an exemplary embodiment will described in more detail.

As a material of the substrate insulating layer 111, an insulating material like a thermosetting resin such as an epoxy resin, a thermoplastic resin such as polymide, or a material including a reinforcing material such as an inorganic filler together with the above resin materials, for example, an Ajinomoto Build-up Film (ABF) may be used. However, the present disclosure is not limited thereto, and a Photo-Imageable Dielectric (PID), or the like, may be used. Even when the materials of the respective layers of the substrate insulating layer 111 are the same, boundaries therebetween may be clear.

The substrate wiring layer 112 may include an antenna pattern realizing an mm Wave/5G antenna, and may further include a ground pattern, a feed pattern, or the like. The antenna pattern may be a dipole antenna, a patch antenna, or the like, depending on the disposition and the shape of the antenna pattern. The ground pattern may be in a form of a ground plane. A periphery of the antenna pattern may be surrounded by a ground pattern disposed at the same level, but is not limited thereto. The substrate wiring layer 112 may include other signal patterns or power patterns, resistance patterns, or the like. The substrate wiring layer 112 may be formed of a conductive material, such as copper (Cu), aluminum (Al), silver (Ag), tin (Sn), gold (Au), nickel (Ni), lead (Pb), titanium (Ti), or alloys thereof, but is not limited thereto.

The connection via layer 113 may electrically connect the substrate wiring layer 112 formed on the different layers, thereby providing an electrical path in the antenna substrate 100. The connection via layer 113 may include a feeding via electrically and/or signally-connected to the antenna pattern, and may further include a ground connection via, or the like. The connection via layer 113 may include other signal connection vias, power connection vias, or the like. A portion of the ground connection vias may surround the periphery of the feeding vias. The connection via layer 113 may be formed of a conductive material such as copper (Cu), aluminum (Al), silver (Ag), tin (Sn), gold (Au), nickel (Ni), lead (Pb), titanium (Ti), or alloys thereof. A connection via of each of the connection via layers 113 may be entirely filled with the conductive material, or the conductive material may be formed along a wall of each of via holes unlike illustrated in the drawing. In addition, the connection via of each of the connection via layers may have all of any known vertical cross-sectional shapes such as a cylindrical shape, an hourglass shape, a tapered shape, or the like.

According to exemplary embodiments, the antenna substrate 100 may include a core layer, and it may be a form in which the substrate insulating layer 111 is built-up on both sides based on the core layer. An insulating material may be used as a material of the core layer. In this case, the insulating material may be a thermosetting resin such as an epoxy resin, a thermoplastic resin such as a polyimide resin, a material containing a reinforcing material such as a glass fiber (or a glass cloth or a glass fabric) and/or an inorganic filler together with the thermosetting resin and the thermoplastic resin, for example, prepreg. However, the material of the core layer 110 is not limited to the resin, and may be, for example, a glass plate or a ceramic plate.

The substrate passivation layers 122 and 124 may be disposed between upper and lower surfaces of the antenna substrate 100 to protect internal components of the antenna substrate 100. The substrate passivation layers 122 and 124 may also include an insulating layer, respectively, for example, an ABF, or the like, but are not limited thereto.

The frame 210 may have a plurality of first to fifth through-holes 210H1, 210H2, 210H3, 210H4, and 210H5. The first to fifth through-holes 210H1, 210H2, 210H3, 210H4, and 210H5 may be disposed to be physically spaced apart. The wiring chip 260, the first and second semiconductor chips 221 and 222, and the passive component 225 may be disposed side by side with a predetermined distance, respectively. As illustrated in FIG. 10, the wiring chip 260, the first and second semiconductor chips 221 and 222, and the passive component 225 may be disposed to be spaced apart from wall surfaces of the through-holes 210H1, 210H2, 210H3, 210H4, and 210H5 by a predetermined distance, and may be surrounded by wall surfaces of the through-holes 210H1, 210H2, 210H3, 210H4, and 210H5, but is not limited thereto.

The frame 210 may include the insulating layer 211, the wiring layer 212 disposed on both surfaces of the insulating layer 211, and a metal layer 215 disposed on internal walls of the through-holes 210H1, 210H2, 210H3, 210H4, and 210H5. Therefore, the wiring layer 212 disposed on both surfaces of the insulating layer 211 may be electrically connected through the metal layer 215. Since the frame 210 includes the wiring layer 212, the number of layers of the connection member 240 may be reduced. In addition, the frame 210 may further improve rigidity of the semiconductor package 200A according to specific materials, and may perform securing uniformity of the thickness of the encapsulant 230, or the like.

An insulating material may be used as the material of the insulating layer 211. In this case, the insulating material may be a thermosetting resin such as an epoxy resin, a thermoplastic resin such as polyimide, or an insulating material impregnated with a core material such as an inorganic filler and/or a glass fiber (or a glass cloth or a glass fabric), for example, a prepreg, an Ajinomoto Build-up Film (ABF), FR-4, Bismaleimide Triazine (BT), or the like, but is not limited thereto. For example, as the material of the insulating layer 211, a glass or ceramic-based insulating material may be applied to obtain desired material properties.

The wiring layer 212 may perform the function of redistributing the connection pads 221P and 222P of the semiconductor chips 221 and 222. In addition, the wiring layer may be used as a connection pattern when electrically connecting the semiconductor package 200A to the upper and lower other components. A material of the wiring layer 212 may be a conductive material such as copper (Cu), aluminum (Al), silver (Ag), tin (Sn), gold (Au), nickel (Ni), lead (Pb), titanium (Ti), or alloys thereof.

The metal layer 215 may be disposed on the internal walls of the through-holes 210H1, 210H2, 210H3, 210H4, and 210H5, respectively. The metal layer 215, as illustrated in FIG. 10, may be disposed to surround the wiring chip 260, the passive component 225, the semiconductor chips 221 and 222, respectively, and may be connected to at least a portion of the wiring layer 212 of the frame 210 in at least one area. The metal layer 215 may include a conductive material such as copper (Cu), aluminum (Al), silver (Ag), tin (Sn), gold (Au), nickel (Ni), lead (Pb), titanium (Ti), or alloys thereof. The metal layer 215 may be formed by a plating process, and may include a seed layer and a conductor layer. The metal layer 215 may be used as a ground, and in this case, may be electrically connected to the ground of the redistribution layer 242 of the connection member 240.

The wiring layer 260 may include a body portion 261, a plurality of through vias 263 penetrating the body portion 261, and a via wiring layer 262 disposed on upper and lower surfaces of the body portion 261 and connected to the through via 263. As illustrated in FIG. 10, the plurality of through vias 263 may be disposed in rows and columns, and may be encapsulated or molded by a body portion 261 to be mounted in the first and fifth through-holes 210H1 and 210H5 in chip form. The wiring chip 260 may be disposed at an edge of the semiconductor package 200A outside of the passive component 225, but is not limited thereto. The wiring chip 260 may be mounted in the through-holes 210H1 and 210H5 separate from the semiconductor chips 221 and 222, and may be disposed such that the side surface thereof is surrounded by the metal layer 215. Therefore, the electromagnetic wave shielding with the semiconductor chips 221 and 222 may be enhanced.

The body portion 261 may include an insulating material like a thermosetting resin such as an epoxy resin, a thermoplastic resin such as polymide, a liquid crystal polymer (LCP) resin, or a resin containing a reinforcing material such as an inorganic filler together with the above resin materials, specifically, ABF, FR-4, BT, PID resin, and the like. The body portion 261 may include an insulating material forming various types of package substrates including, for example, a printed circuit board (PCB), a rigid flexible PCB (RFPCB), or may be comprised of a portion of the package substrate. In addition, the body portion 261 may use a molding material such as EMC, or the like.

The through via 263 may penetrate the upper and lower surfaces of the body portion 261 and may form an electrical path between the antenna substrate 100 and the semiconductor chips 221 and 222. Particularly, a high frequency signal may be transmitted through the through via 263. A material of the through via 263 may be a conductive material such as copper (Cu), aluminum (Al), silver (Ag), tin (Sn), gold (Au), nickel (Ni), lead (Pb), titanium (Ti), or alloys thereof. The through via 263 may be entirely filled with the conductive material, but is not limited thereto.

A via wiring layer 262 may be disposed on upper and lower surfaces of the through via 263 to be connected to a redistribution via 243 of a connection member 240 and a backside via 293 of a backside wiring structure 290. According to exemplary embodiments, the via wiring layer 262 may have a form in which at least portions of the via wiring layers 262 are embedded into the body portion 261.

The semiconductor chips 221 and 222 may include a first semiconductor chip 221 and a second semiconductor chip 222 performing different functions. At this time, the first semiconductor chip 221 may be a power management integrated circuit (PMIC), and the second semiconductor chip 222 may be a radio frequency integrated circuit (RFIC), and they may be electrically connected to each other. The first semiconductor chip 221 may be mounted on the second through-hole 210H2, and the semiconductor chip 222 may be mounted on the other fourth through-hole 210H4 disposed to be spaced apart from the second through-hole 210H2.

In the semiconductor chips 221 and 222, a surface on which the connection pads 221P and 222P are disposed may be an active surface, and an opposite surface thereof may be an inactive surface. The semiconductor chips 221 and 222 may be formed based on an active wafer, and in this case, silicon (Si), germanium (Ge), gallium arsenide (GaAs), or the like may be used as a base material. The connection pads 221P and 222P may be for electrically connecting the semiconductor chips 221 and 222 with other components. As a material of the semiconductor chips 221 and 222, a conductive material such as aluminum (Al), or the like may be used with any particular limitations. The semiconductor chips 221 and 222 may be electrically connected to the antenna substrate 100 and the passive component 225 through the connection pads 221P and 222P, the connection member 240, and the like. The number and the dispositional form of the semiconductor chips 221 and 222 mounted on the antenna substrate 100 may be variously changed in the exemplary embodiments.

The passive component 225 may be disposed in the third through-hole 210H3. The passive component 225 may be an electronic component such as a capacitor, an inductor, or the like. As an example which is not limited, the passive component 225 may be capacitor, more specifically, a multilayer ceramic capacitor (MLCC). The passive component 225 may be electrically connected to the connection pads 221P and 222P of the semiconductor chips 221 and 222 through the connection member 240. The number and the dispositional form of the passive component 225 mounted in the semiconductor package 200A may be variously changed in the exemplary embodiments. For example, according to the exemplary embodiments, the passive component 225 may be disposed in a plurality of different through-holes 210H1, 210H2, 210H3, 210H4, and 210H5, respectively or may be disposed together with the semiconductor chips 221 and 222 in the same through-holes 210H2 and 210H4 in which the semiconductor chips 221 and 222 are disposed.

The encapsulant 230 may protect the wiring chip 260, the semiconductor chips 221 and 222, the passive component 225, or the like and provide an insulating area. The encapsulant 230 may fill at least a portion of the through-holes 210H1, 210H2, 210H3, 210H4, and 210H5 and encapsulate the wiring chip 260, the semiconductor chips 221 and 222, and the passive component 225. An encapsulation form may not be particularly limited, and may be a form surrounding at least a portion of the wiring chip 260, the semiconductor chips 221 and 222, and the passive component 225. For example, the encapsulant 230 may cover the side surfaces and the inactive surfaces of each of the semiconductor chips 221 and 222 and may cover the side surfaces and the lower surfaces of the wiring chip 260 and the passive component 225. A specific material of the encapsulant 230 may not be particularly limited, and an insulating material such as ABF, or the like may be used. If required, a Photo-Imageable encapsulant (PIE) may be used. The encapsulant 230 may be composed of a plurality of encapsulants like a first encapsulant encapculating the passive component 225 and a second encapsulant encapsulating the semiconductor chips 221 and 222, as required.

The connection member 240 may redistribute the connection pads 221P and 222P of the semiconductor chips 221 and 222. Through the connection member 240, several tens or several hundreds of the connection pads 221P and 222P of the semiconductor chips 221 and 222, which have a variety of functions, may be redistributed, respectively. In addition, the connection member 240 may electrically connect the connection pads 221P and 222P of the semiconductor chips 221 and 222 to the passive component 225. In addition, the connection member 240 may provide an electrical connection path to the antenna substrate 100. The connection member 240 may include a redistribution insulating layer 241, a redistribution layer 242 disposed on the redistribution insulating layer 241, and a redistribution via 243 penetrating the redistribution insulating layer 241 and connected to the redistribution layer 242. The connection member 240 may be composed of a single layer, and may be designed to have a plurality of layers, greater or smaller in number than depicted in the drawings.

An insulating material may be used as a material of the redistribution insulating layer 241, and in addition to the above-described insulating materials, a photosensitive insulating material such as a PID resin may be used as the insulating material. The redistribution insulating layer 241 may be a photosensitive insulating layer containing an insulating resin and an inorganic filler, respectively.

The redistribution layer 242 may perform redistributing the connection pads 221P and 222P substantially, and a material of the redistribution layer may be a conductive material such as copper (Cu), aluminum (Al), silver (Ag), tin (Sn), gold (Au), nickel (Ni), lead (Pb), titanium (Ti), or alloys thereof. The redistribution layer 242 may perform various functions depending on designs of the layer. For example, the redistribution layer may include a ground pattern (GND) pattern, a power (PWR) pattern, a signal (S) pattern, and the like. Here, the signal (S) pattern may include various signals other than the ground (GND) pattern, the power (PWR) pattern, and the like, such as data signals, and the like. In addition, the redistribution layer may include a via pad, or the like. The redistribution layer 242 may include a feed pattern.

The redistribution via 243 may electrically connect the redistribution layer 242 formed on different layers, the connection pads 221P and 222P, the passive component 225, and the like, thereby forming an electrical path between the antenna substrate 100 and other configurations. A material of each of the redistribution vias 243 may be a conductive material such as copper (Cu), aluminum (Al), silver (Ag), tin (Sn), gold (Au), nickel (Ni), lead (Pb), titanium (Ti), or alloys thereof. Each of the redistribution vias 243 may be entirely filled with the conductive material, or may be formed along a wall of the vias. In addition, the shape thereof may have a tapered shape opposite to the direction of the backside via 293. The redistribution via 243 may include a feeding via.

A passivation layer 250 having an opening exposing at least a portion of the redistribution layer 242 may be disposed on the upper surface of the connection member 240. The passivation layer 250 may protect the connection member 240 from external physical and chemical damage, or the like. The passivation layer 250 may include an insulating resin and an inorganic filler, but may not include a glass fiber. For example, the passivation layer may be ABF, but is not limited thereto, and may be a PID, a solder resist, or the like.

A plurality of electrical connection structures 270 electrically connected to the exposed redistribution layer 242 may be disposed on the opening of the passivation layer 250. The electrical connection structure 270 may be for physically and/or electrically connecting the semiconductor package 200A to the antenna substrate 100. The electrical connection structure 270 may be formed of a low meting point metal, such as tin (Sn) or alloys containing tin (Sn), more specifically solder, or the like, but this is merely an example, but the material thereof is not particularly limited thereto. The electrical connection structure 270 may be a land, a ball, a pin, or the like. The electrical connection structure 270 may be formed of multiple layers or a single layer. In the case of a multi-layered structure, it may include a copper pillar and a solder, and in the case of a single layer, it may include tin-silver solder or copper, but this is also merely an example, but is not limited thereto. The number, spacing, a dispositional form of the electrical connection structure 270, or the like are not particularly limited, and may be sufficiently modified according to design specifications for a typical engineer.

At least one of the electrical connection structure 270 may be disposed in a fan-out area. The fan-out area refers to an area outside in which the semiconductor chips 221 and 222 are disposed. A fan-out package may have excellent reliability as compared to a fan-in package, may implement multiple I/O terminals, and may facilitate a 3D interconnection. In addition, as compared to a ball grid array (BGA) package, a land grid array (LGA) package, or the like, the fan-out package may be manufactured to have a reduced package thickness, and may have price competitiveness.

The backside wiring structure 290 including a backside wiring layer 292 and a backside via 293 may be disposed on a lower portion of the encapsulant 230. The backside wiring layer 292 may be connected to the wiring layer 212 of the frame 210 and the metal layer 215 through the backside via 293 penetrating the encapsulant 230. The backside wiring layer 292 and the backside via 293 may include a conductive material such as copper (Cu), aluminum (Al), silver (Ag), tin (Sn), gold (Au), nickel (Ni), lead (Pb), titanium (Ti), or alloys thereof. The backside wiring layer 292 may include a signal pattern, a signal via pad, or the like. A backside metal layer 292S may cover the inactive surface of the semiconductor chips 221 and 222, and may be connected to the wiring layer 212 of the frame 210 through the backside via 293, thereby realizing an excellent heat radiation effect and an excellent electromagnetic wave shielding effect. The backside metal layer 292S may also be connected to a ground pattern of the wiring layer 212 of the frame 210 to be used as a ground. According to exemplary embodiments, an opening may be formed in the backside wiring structure 290 to expose a portion of the backside wiring layer 292. In this case, a connection structure such as the electrical connection structure 270 may be disposed in the opening to mount an antenna module 500A on an external device such as a board.

FIGS. 11A to 11E are schematic cross-sectional views illustrating an example a process forming the antenna module of FIG. 9.

Figure 11A:
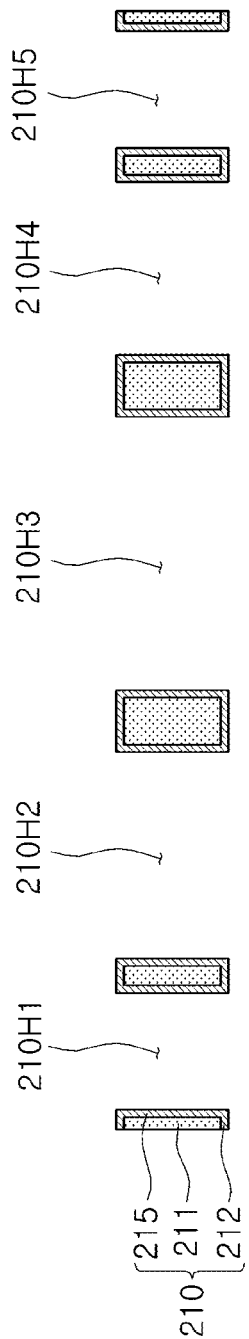
FIGS. 11A to 11E are schematic cross-sectional views and cross-sectional views illustrating an example of a process of forming the antenna module of FIG. 9.

Referring to FIG. 11A, the frame 210 may be prepared, the first to fifth through-holes 210H1, 210H2, 210H3, 210H4, and 210H5 penetrating the upper and lower surfaces of the frame 210 may be formed, the metal layer 215 may be formed on the internal walls of the through-holes 210H1, 210H2, 210H3, 210H4, and 210H5, and the wiring layer 212 may be formed on the upper and lower surfaces thereof. The through-holes 210H1, 210H2, 210H3, 210H4, and 210H5 may be formed by mechanical drilling and/or laser drilling. However, the present disclosure is not limited thereto, and the through-holes may be performed by a sandblast method using particles for polishing, a dry etching method using plasma, or the like, depending on a material of the insulating layer 211. A size, a shape, and the like, of the through-holes 210H1, 210H2, 210H3, 210H4, and 210H5 may be designed in accordance with a size, a shape, a number, and the like of the wiring chip 260, the semiconductor chip 221 and 222 to be mounted. The metal layer 215 may be formed by a plating process, and may be formed together with the wiring layer 212 of the frame 210. The metal layer 215 may be connected to the wiring layer 212 on the upper and lower surfaces of the frame 210. It may be interpreted that a portion of the wiring layer 212 forms the metal layer 215, and in this case, the metal layer 215 may specifically refer to an area disposed in the internal walls of the through-holes 210H1, 210H2, 210H3, 210H4, and 210H5 of the wiring layer 212.

Figure 11B:
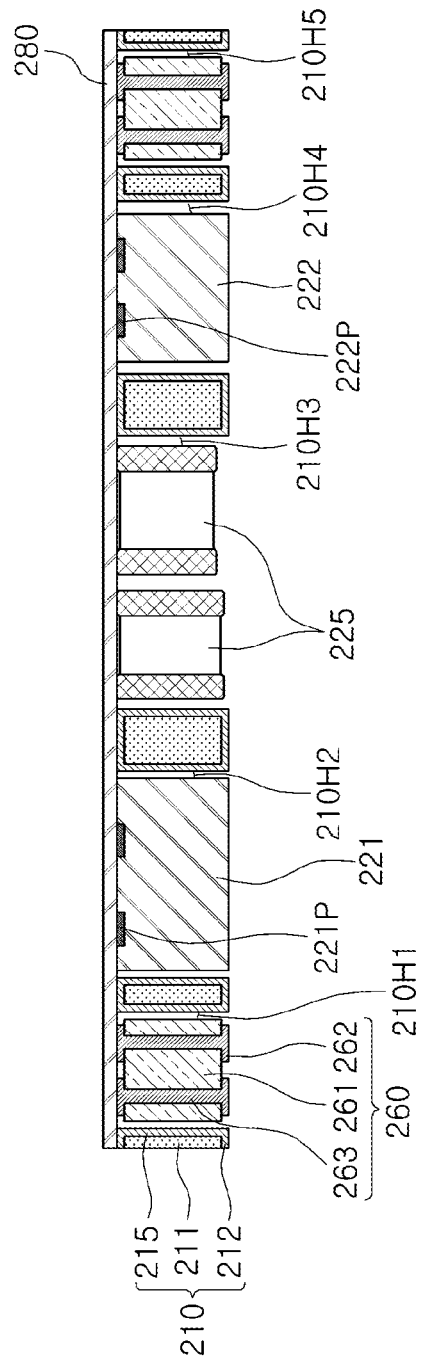

Referring to FIG. 11B, an adhesive film 280 may be attached to one side of the frame 210, the wiring chip 260, the semiconductor chips 221 and 222, and the passive component 225 may be disposed in the through-holes 210H1, 210H2, 210H3, 210H4, and 210H5. The wiring chip 260 may be disposed in the first and fifth through-holes 210H1 and 210H5, the semiconductor chips 221 and 222 may be disposed in the second and fourth through-holes 210H2 and 210H4, and the passive component 225 may be disposed in the third through-hole 210H3. Any type of adhesive film 280 may be used as long as the adhesive film 280 is able to fix the frame 210. As an example which is not limited, a known tape may be used as the adhesive film 280. An example of the known tape may be a thermal treatment curable adhesive tape of which adhesive strength weakens by thermal treatment, an ultraviolet curable adhesive tape of which adhesive strength weakens by ultraviolet radiation, and the like. The wiring chip 260, the semiconductor chips 221 and 222, and the passive component 225 may be disposed, for example, by attaching them to the a surface of the adhesive film 280 in the through-holes 210H1, 210H2, 210H3, 210H4, and 210H5.

Figure 11C:
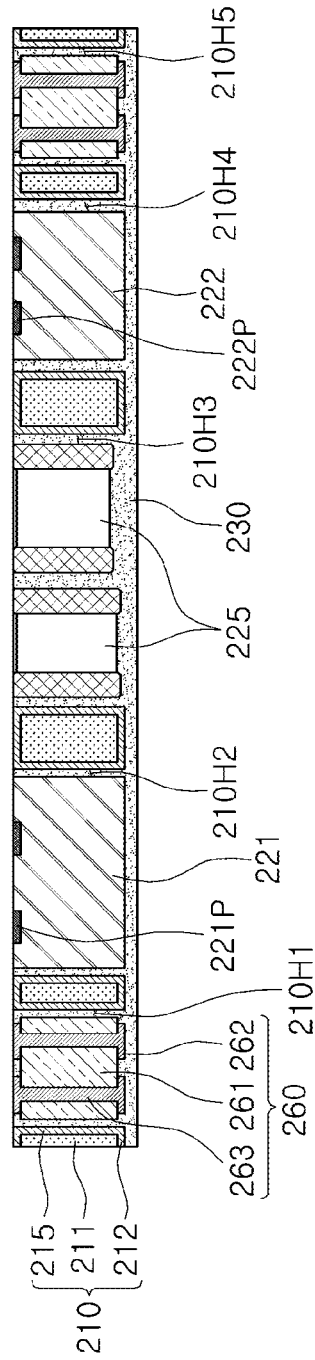

Referring to FIG. 11C, the wiring chip 260, the semiconductor chips 221 and 222, and the passive component 225 may be encapsulated using the encapsulant 230, and the adhesive film 280 may be stripped. The encapsulant 230 may encapsulate at least lower surfaces of the frame 210, the wiring chip 260, the semiconductor chips 221 and 222, and the passive component 225, and may fill a space in the through-holes 210H1, 210H2, 210H3, 210H4, and 210H5. The encapsulant 230 may be formed by a known method. For example, the encapsulant 230 may be formed by laminating and curing a precursor of the encapsulant 230, or may be formed by coating a surface of the adhesive film 280 with the encapsulant 230 to encapsulate the wiring chip 260, the semiconductor chips 221 and 222, and the passive component 225 and being cured. By the curing, the wiring chip 260, the semiconductor chips 221 and 222, and the passive components 225 may be fixed. As the laminating method, for example, a method in which a hot press process where a pressure is applied to an object in a high temperature for a certain period of time and is reduced, the object is cooled in a cold press, and a working tool is separated, or the like, may be used. As the coating method, for example, a screen printing method of applying ink using a squeegee, a spray printing method of atomizing ink and spraying the atomized ink, or the like, may be used. The method of stripping the adhesive film 280 may not be particularly limited, but may be implemented by a known method. For example, in the case in which a thermal treatment curable adhesive tape of which adhesive strength weakens by thermal treatment, an ultraviolet curable adhesive tape of which adhesive strength weakens by ultraviolet radiation, or the like is used, the stripping of the adhesive film 280 may be formed after weakening an adhesive strength thereof by thermal treatment of the adhesive film 280, or by radiating ultraviolet rays to the adhesive film 280.

Figure 11D:
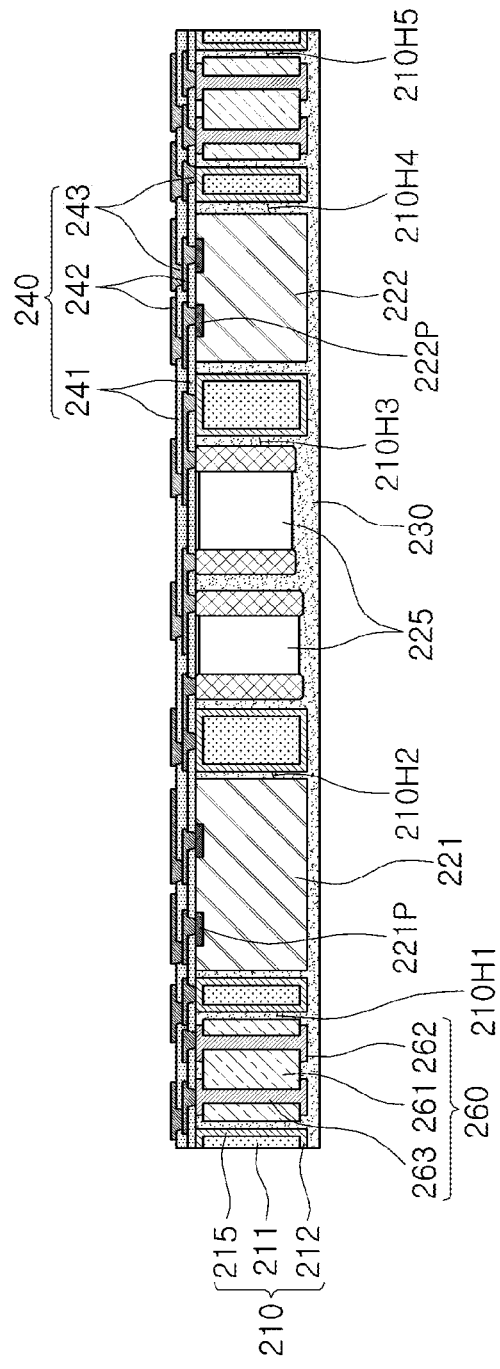

Referring to FIG. 11D, the connection member 240 may be formed on the frame 210 from which the adhesive film 280 is removed, the wiring chip 260, the upper surface of the passive component 225 and the active surfaces of the semiconductor chips 221 and 222. The connection member 240 may be formed by sequentially forming the redistribution insulating layer 241 and then forming the redistribution layer 242 and the redistribution via 243 in the corresponding layer, respectively.

Figure 11E:
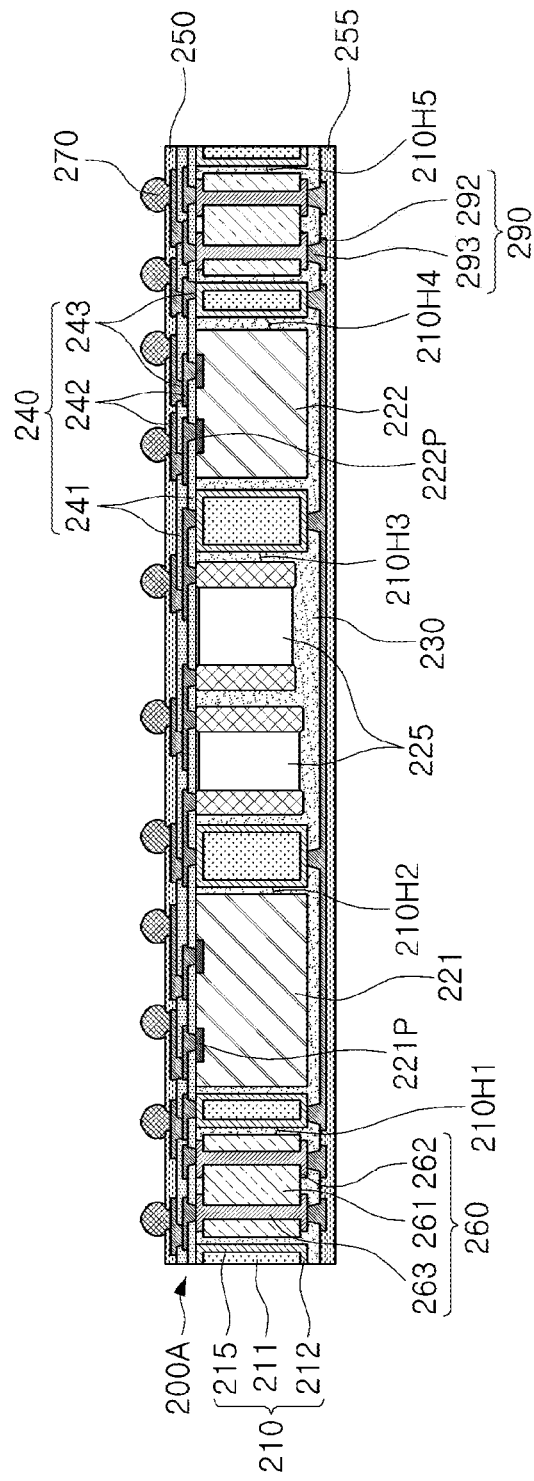

Referring to FIG. 11E, the backside wiring structure 290 including the backside wiring layer 292 and the backside via 293 may be formed and the passivation layer 250 covering the connection member 240 and the backside passivation layer 255 covering the backside wiring structure 290 may be formed on the lower surface of the encapsulant 230. In addition, an opening exposing at least a portion of the redistribution layer 242 to the passivation layer 250 may be formed, and the electrical connection structure 270 may be formed on the opening. The backside via 293 may penetrate the encapsulant 230 to connect the backside wiring layer 292 and the wiring layer 212. The backside wiring layer 292 and the backside via 293 may be formed by a plating process. The passivation layer 250 may be formed by laminating and curing a precursor of the passivation layer 250, or may be formed by coating a material for forming the passivation layer 250 and curing the coated material. The backside passivation layer 255 may be formed by the same method as above, and may be formed simultaneously with the passivation layer 250, or formed by a separate process. A method of forming the electrical connection structure 270 may not be particularly limited, but may be formed by a well-known method in the respective technical field depending on a structure or a shape. The electrical connection structure 270 may be fixed by reflow, and to enhance fixing strength, a portion of the electrical connection structure 270 may be embedded in the passivation layer 250, and a remaining portion may be exposed externally, thereby improving reliability. A separate underbump metal layer may be further disposed on a lower portion of the electrical connection structure 270. The semiconductor package 200A may be ultimately manufactured by the processes as described above.

Next, referring to FIG. 9, the semiconductor package 200A and the prepared antenna substrate 100 may be connected to be stacked up and down. The antenna substrate 100 may be connected to the semiconductor package 200A through the electrical connection structure 270. The electrical connection structure 270 may be connected to the substrate wiring layer 112 exposed through the opening of the substrate passivation layer 124. Thus, the antenna module 500A as illustrate in FIG. 9 may be ultimately manufactured.

Figure 12:
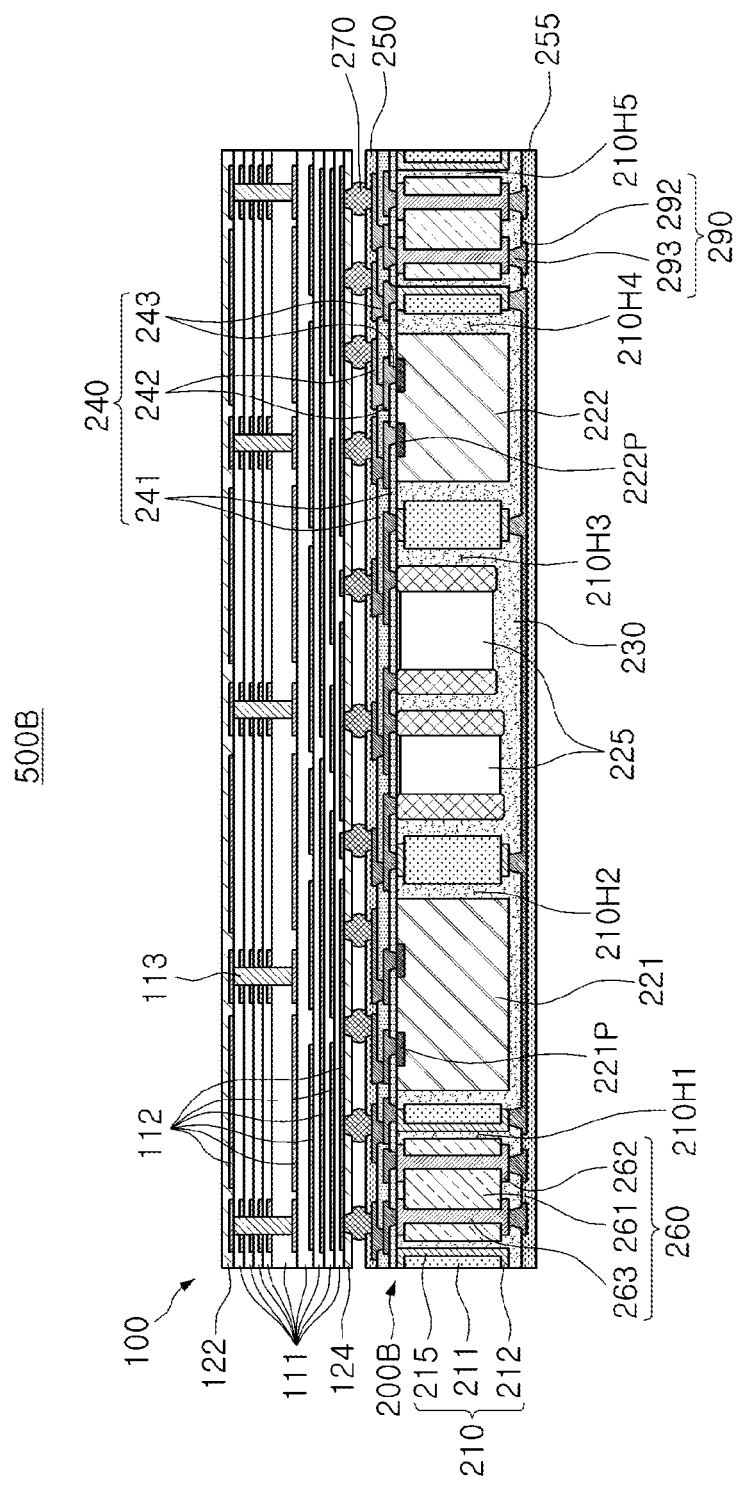
FIG. 12 is schematic cross-sectional view illustrating another example of an antenna module.

FIG. 12 is a schematic cross-sectional view illustrating another example of an antenna module.

Referring to FIG. 12, in an antenna module 500B according to another example, a metal layer 215 of a semiconductor package 200B may be disposed only in a portion of the first to fifth through-holes 210H1, 210H2, 210H3, 210H4, and 210H5. Specifically, the metal layer 215 may be disposed only on the internal walls of the first and fifth through-holes 210H1 and 210H5 in which the wiring chip 260 is disposed. That is, the metal layer 215 may not be necessarily disposed in the entirety of the through-holes 210H1, 210H2, 210H3, 210H4, and 210H5, but may be disposed only in some of the through-holes 210H1 and 210H5 in which shielding of electromagnetic waves is particularly important. According to exemplary embodiments, the metal layer 215 may be further disposed in the second and fourth through-holes 210H2 and 210H4 in which the semiconductor chips 221 and 222 are disposed. The metal layer 215 may be electrically floating or may be used as a ground, and in this case, the metal layer 215 may be electrically connected to the ground of the redistribution layer 242. The descriptions for the other portions are substantially the same as in the description of the antenna module 500A according to the above-described example, such that a detailed description will be omitted.

Figure 13:
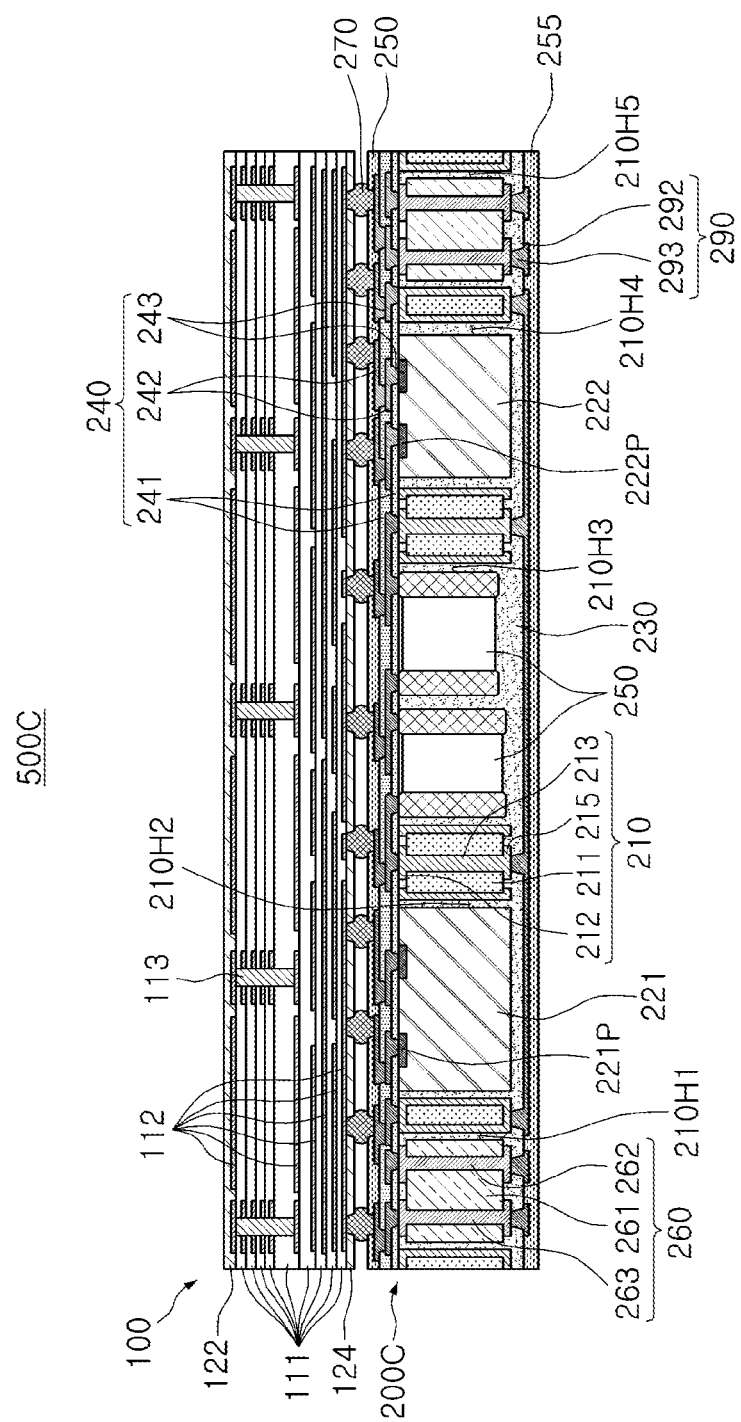
FIG. 13 is a schematic cross-sectional view illustrating another example of an antenna module.

FIG. 13 is a schematic cross-sectional view illustrating another example of an antenna module.

Referring to FIG. 13, in an antenna module 500C according to another example, a via 213 through which the frame 210 of the semiconductor package 200C penetrates the insulating layer 211 may be further included. Therefore, the wiring layers 212 disposed on both surfaces of the insulating layer 211 may be electrically connected through the via 213 as well as the metal layer 215. In this case, an electrical signal transmitted through the via 213 may be different in a type, function, and/or a frequency band from that of the electrical signal transmitted through the through via 263 in the wiring chip 260. For example, an electrical signal transmitted through the via 213 may be a signal in a lower frequency band than an electrical signal transmitted through the through via 263. As a material for forming the via 213, a conductive material may be used. The via 213 may be entirely filled with a conductive material, or the conductive material may be formed along a wall of a via hole. In addition, the via may have all known shapes such as a cylindrical shape as well as a tapered shape may be applied. The descriptions for the other portions are substantially the same as in the description of the antenna module 500A according to the above-described example, such that a detailed description will be omitted.

Figure 14:
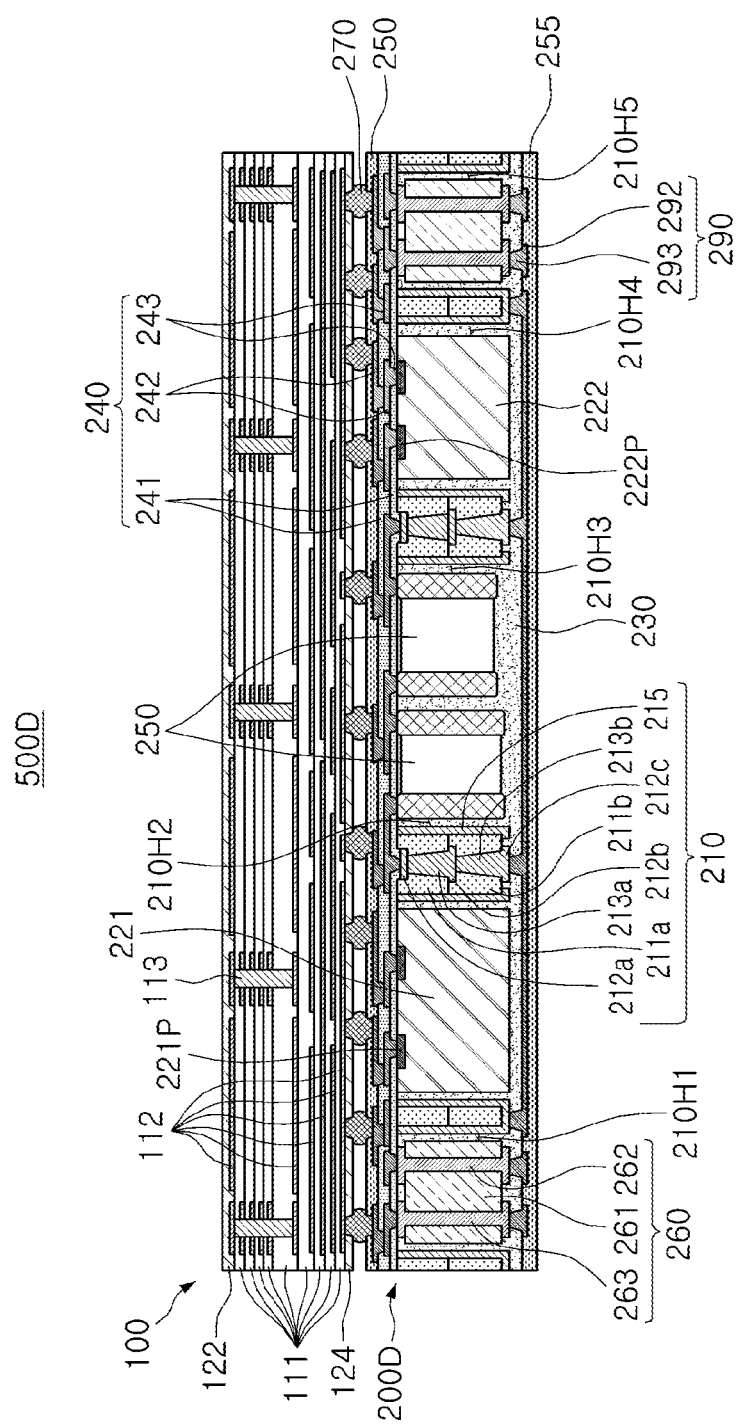
FIG. 14 is a schematic cross-sectional view illustrating another example of an antenna module.

FIG. 14 is a schematic cross-sectional view illustrating another example of a semiconductor package.

Referring to FIG. 14, in an antenna module 500D according to another example, a frame 210 of a semiconductor package 200D may include a first insulating layer 211a contacting the connection member 240, a first wiring layer 212a contacting the connection member 240 and embedded in the first insulating layer 211a, a second wiring layer 212b disposed to oppose an area of the first insulating layer 211a in which the first wiring layer 212a is embedded, a second insulating layer 211b disposed on the first insulating layer 211a and covering the second wiring layer 212b, and a third wiring layer 212c disposed on the second insulating layer 211b. As the frame 210 includes a larger number of wiring layers 212a, 212b, and 212c, and the connection member 240 may be further simplified. Accordingly, yield degradation caused by defects occurring in the process of forming the connection member 240 may be resolved. Meanwhile, the first to third wiring layers 212a, 212b, and 212c may be electrically connected to the connection pads 221P and 222P. The first and second wiring layers 212a and 212b and the second and third wiring layers 212b and 212c may be electrically connected through the first and second vias 213a and 213b penetrating the first and second insulating layers 211a and 211b, respectively.

The first wiring layer 212a may be recessed internally of the first insulating layer 211a. In the case in which the first wiring layer 212a is recessed internally of the first insulating layer 211a as above, so that a lower surface of the first insulating layer 211a and a lower surface of the first wiring layer 212a have stepped portions, pollution of the first wiring layer 212a caused by bleeding of the material of the encapsulant 230 may be prevented. Thicknesses of the wiring layers 212a, 212b, and 212c of the frame 210 may be greater than that of the redistribution layer 242 of the connection member 240.

When a hole for the first via 213a is formed, some of pads of the first wiring layer 212a may serve as a stopper. Thus, it may be favorable to configure the first via 213a to have a tapered shape in which a width of an upper surface of the first via 213a is greater than that of a lower surface in terms of process. In this case, the first via 213a may be integrated with a pad pattern of the second wiring layer 212b. Also, when a hole for the second via 213b is formed, some of pads of the second wiring layer 212b may serve as a stopper, and thus, it may also be favorable to configure the second via 213b to have a tapered shape in which a width of an upper surface of the second via 213b is greater than that of a lower surface in terms of process. In this case, the second via 213b may be integrated with a pad pattern of the third wiring layer 212c.

The descriptions of the other portions are substantially the same as in the description of the antenna module 500A according to the above-described example, such that a detailed description will be omitted.

Figure 15:
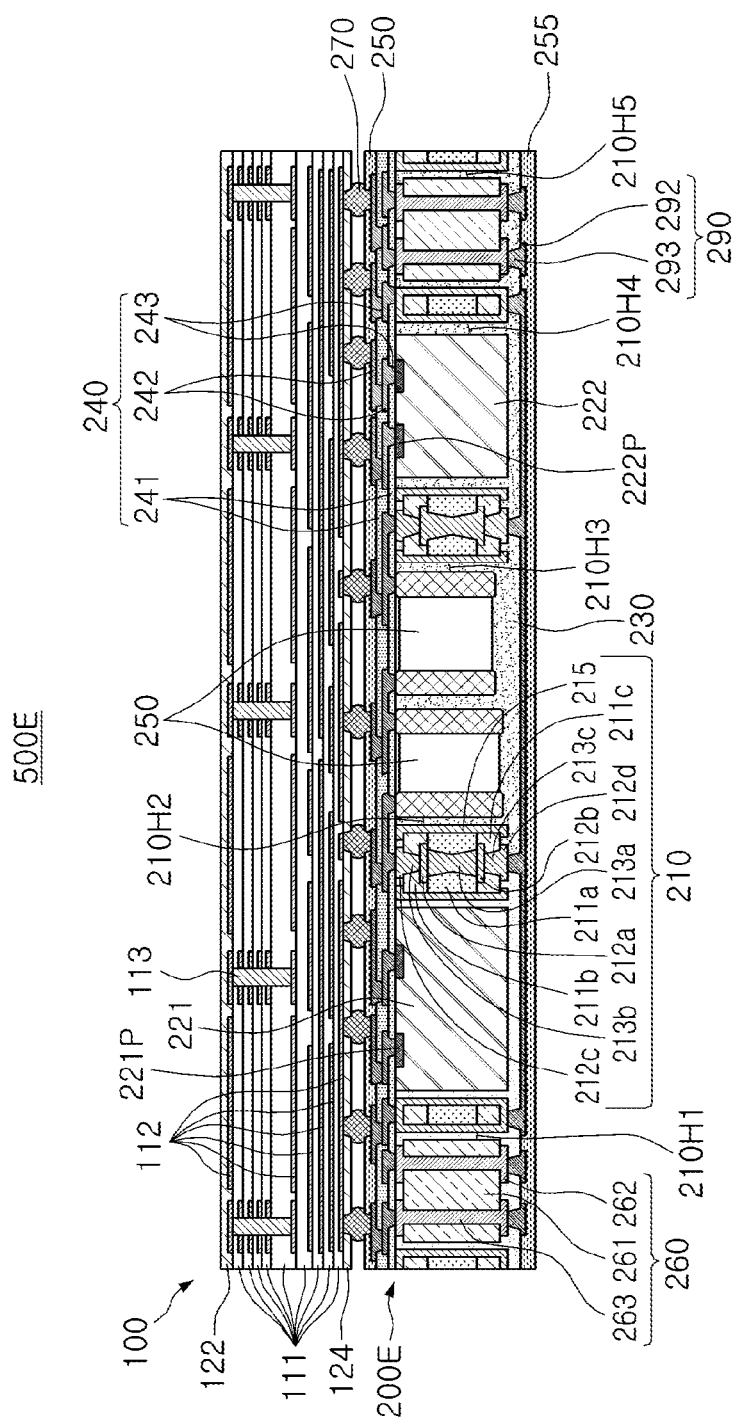
FIG. 15 is a schematic cross-sectional view illustrating another example of an antenna module.

FIG. 15 is a schematic cross-sectional view illustrating another example of a semiconductor package.

Referring to FIG. 15, in an antenna module 500E according to another example, a frame 210 of a semiconductor package 200E may include a first insulating layer 211a, a first wiring layer 212a and a second wiring layer 212b disposed on both surfaces of the first insulating layer 211a, a second insulating layer 211b disposed on the first insulating layer 212a and covering the first wiring layer 212a, a third redistribution layer 212c disposed on the second insulating layer 211b, a third insulating layer 211c disposed on the first insulating layer 211a and covering the second wiring layer 212b, and a fourth wiring layer 212d disposed on the third insulating layer 211c. The first to fourth wiring layers 212a, 212b, 212c, and 212d may be electrically connected to connection pads 221P and 222P. As the frame 210 include a larger number of wiring layers 212a, 212b, 212c, and 212d, a connection member 240 may be further simplified. Accordingly, yield degradation caused by defects occurring in the process of forming the connection member 240 may be resolved. Meanwhile, the first to fourth wiring layers 212a, 212b, 212c and 212d may be electrically connected through the first to third vias 213a, 213b, and 213c penetrating the first to third insulating layers 211a, 211b, and 211c, respectively.

A thickness of the first insulating layer 211a may be greater than those of the second and third insulating layers 211b and 211c. Basically, the first insulating layer 211a may have a relatively large thickness to maintain stiffness, and the second and third insulating layers 211b and 211c may be introduced to form a larger number of wiring layers 212c and 212d. The first insulating layer 211a may include an insulating material different from those of the second and third insulating layers 211b and 211c. For example, the first insulating layer 211a may be, for example, a prepreg including a core, a filler, and an insulating resin, and the second and third insulating layers 211b and 211c may be an ABF film or a PID film including a filler and an insulating resin, but are not limited thereto. Similarly, the first via 213a penetrating the first insulating layer 211a may have a diameter greater than those of the second and third vias 213b and 213C penetrating the second and third insulating layers 211b and 211c. Thicknesses of the wiring layers 212a, 212b, 212c, and 212d of the frame 210 may be greater than that of the redistribution layer 242 of the connection member 240. The descriptions for the other portions are substantially the same as in the description of the antenna module 500A according to the above-described example, such that a detailed description will be omitted.

As set forth above, according to the present disclosure, a semiconductor package and an antenna module including the same having improved electrical shielding between a through via and a semiconductor chip may be provided.

While the exemplary embodiments have been shown and described above, it will be apparent to those skilled in the art that modifications and variations could be made without departing from the scope of the present invention as defined by the appended claims.

What is claimed is:

1. A semiconductor package comprising:
a frame having a first through-hole and a second through-hole;
a semiconductor chip disposed in the first through-hole, and having an active surface on which a connection pad is disposed and an inactive surface opposing the active surface;
a wiring chip disposed in the second through-hole, the wiring chip comprising a body portion and through vias penetrating a top surface and a bottom surface of the body portion;
an encapsulant encapsulating at least a portion of the semiconductor chip and a portion of the wiring chip; and
a connection member disposed on the active surface of the semiconductor chip and including a redistribution layer electrically connected to the connection pad and the through vias.

2. The semiconductor package of claim 1, further comprising a metal layer disposed on an internal wall of the second through-hole to surround the wiring chip.

3. The semiconductor package of claim 1, further comprising a metal layer disposed on internal walls of the first and the second through-holes to surround the semiconductor chip and the wiring chip.

4. The semiconductor package of claim 1, wherein the frame further has a third through-hole,
the semiconductor package, further comprising a passive component disposed on the third through-hole of the frame.

5. The semiconductor package of claim 4, wherein the wiring chip is disposed outwardly of the semiconductor chip and the passive component.

6. The semiconductor package of claim 1, wherein the wiring chip further comprises a via wiring layer disposed on upper and lower surfaces of the body portion and connected to the through vias.

7. The semiconductor package of claim 1, wherein the through vias are disposed in rows and columns in the wiring chip.

8. The semiconductor package of claim 1, further comprising a backside via penetrating the encapsulant to be connected to a wiring layer of the frame; and
a backside wiring layer disposed on the backside via.

9. The semiconductor package of claim 8, wherein a portion of the backside wiring layer is disposed to cover the inactive surface of the semiconductor chip.

10. The semiconductor package of claim 8, wherein the backside via has a linear shape extending in one direction.

11. The semiconductor package of claim 1, wherein the frame comprises an insulating layer, a first wiring layer disposed on an upper surface of the insulating layer, a second wiring layer disposed on a lower surface of the insulating layer, and a connection via penetrating the insulating layer and electrically connecting the first and the second wiring layers.

12. An antenna module comprising:
an antenna substrate including an antenna pattern; and
a semiconductor package disposed on a lower surface of the antenna substrate and electrically connected to the antenna substrate, and having at least one semiconductor chip and at least one wiring chip embedded therein,
wherein each of the at least one wiring chip includes a body portion and a plurality of through vias penetrating the body portion and electrically connecting the antenna substrate and the at least one semiconductor chip, and the semiconductor package includes a metal layer disposed between the at least one semiconductor chip and the at least one wiring chip to shield the at least one wiring chip.

13. The antenna module of claim 12, wherein the semiconductor package comprises a frame having a first through-hole and a second through-hole, the at least one semiconductor chip disposed in the first through-hole of the frame and having an active surface on which a connection pad is disposed and an inactive surface disposed on an opposite side of the active surface, the at least one wiring chip disposed in the second through-hole of the frame, an encapsulant encapsulating at least a portion of the at least one semiconductor chip and a portion of the at least one wiring chip, and a connection member disposed on the active surface of the at least one semiconductor chip and including a redistribution layer electrically connected to the connection pad of the at least one semiconductor chip and the through via of the at least one wiring chip.

14. The antenna module of claim 13, wherein the metal layer is disposed on an internal wall of the second through-hole to surround the at least one wiring chip.

15. The antenna module of claim 13, wherein the frame further has a third through-hole,
the antenna module further comprising a passive component disposed in the third through-hole of the frame.

16. The antenna module of claim 12, wherein the semiconductor package comprises a radio frequency integrated circuit (RFIC) and a power management integrated circuit (PMIC) as the at least one semiconductor chip, and at least one passive component is further embedded in the semiconductor package.

17. An antenna module comprising:
- a semiconductor chip disposed in a first through-hole of a frame, the semiconductor chip having an active surface comprising a connection pad;
- a wiring chip disposed in a second through-hole of the frame, the second through-hole being disposed outwardly of the semiconductor chip, the wiring chip comprising conducting through vias penetrating an insulating body;
- an antenna substrate having an antenna pattern on an upper surface and a wiring layer disposed on a lower surface; and
- a connection member disposed between the active surface and the wiring layer, and the electrically connecting the through vias, the connection pad and the wiring layer.

18. The antenna module of claim 17, wherein a metal layer is disposed on sidewalls of the first through-hole and side walls of the second through-hole.

19. The antenna module of claim 17, further comprising an encapsulant disposed between sidewalls of the first through-hole and the semiconductor chip and sidewalls of the second through-hole and the wiring chip.

20. The antenna module of claim 17, further comprising a passive component disposed in a third through hole of the frame.

21. The antenna module of claim 17, wherein the antenna pattern comprises a mm wave antenna, a ground pattern and a feed pattern.

* * * * *